United States Patent
Curry et al.

(10) Patent No.: US 9,716,202 B2
(45) Date of Patent: Jul. 25, 2017

(54) OPTICALLY ACTIVATED LINEAR SWITCH FOR RADAR LIMITERS OR HIGH POWER SWITCHING APPLICATIONS

(71) Applicant: The Curators of the University of Missouri, Columbia, MO (US)

(72) Inventors: Randy D. Curry, Columbia, MO (US); Robert Druce, Columbia, MO (US); Nathaniel Kinsey, Columbia, MO (US); Heikki Helava, Dix Hills, NY (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 14/421,412

(22) PCT Filed: Aug. 13, 2013

(86) PCT No.: PCT/US2013/054699
§ 371 (c)(1),
(2) Date: Feb. 12, 2015

(87) PCT Pub. No.: WO2014/028468
PCT Pub. Date: Feb. 20, 2014

(65) Prior Publication Data
US 2015/0221804 A1 Aug. 6, 2015

Related U.S. Application Data

(60) Provisional application No. 61/682,606, filed on Aug. 13, 2012.

(51) Int. Cl.
*H01L 31/101* (2006.01)
*H01L 31/09* (2006.01)
(Continued)

(52) U.S. Cl.
CPC .......... *H01L 31/09* (2013.01); *H01L 31/0224* (2013.01); *H01L 31/0304* (2013.01);
(Continued)

(58) Field of Classification Search
CPC ...... H01L 31/10; H01L 31/11; H01L 31/1105; H01L 31/112; H01L 31/1123;
(Continued)

(56) References Cited

U.S. PATENT DOCUMENTS 4,107,721 A 8/1978 Miller
4,782,222 A 11/1988 Ragle et al.
(Continued)

FOREIGN PATENT DOCUMENTS

JP 2009-278003 A 11/2009

OTHER PUBLICATIONS

Kinsey et. al., "Design and Testing of Wide Bandgap Current Limiting Devices", Jun. 7, 2012, Power Modulator and High Voltage Conference (IPMHVC), 2012 IEEE International, pp. 343-346.*
(Continued)

*Primary Examiner* — Earl Taylor
*Assistant Examiner* — Samuel Park
(74) *Attorney, Agent, or Firm* — Polsinelli PC (57) ABSTRACT

The present invention relates to a solid-state optically activated switch that may be used as limiting switch in a variety of applications or as a high voltage switch. In particular, the switch may incorporate the photoconductive properties of a semiconductor to provide the limiting function in a linear mode. In one embodiment, a configuration of the switch allows for greater than 99.9999% off-state transmission and an on-state limiting of less than 0.0001% of the incident signal.

22 Claims, 5 Drawing Sheets

(51) Int. Cl.
*H01L 31/0304* (2006.01)
*H01L 31/041* (2014.01)
*H01L 31/0224* (2006.01)

(52) U.S. Cl.
CPC ...... *H01L 31/03044* (2013.01); *H01L 31/041* (2014.12); *Y02E 10/544* (2013.01)

(58) Field of Classification Search
CPC . H01L 31/1126; H01L 31/09; H01L 31/0224; H01L 31/03044; H01L 31/0304; H01L 31/041; Y02E 10/544
USPC ......... 359/315, 320; 257/431, 462, E31.053, 257/E31.069, E31.073, E31.079, E31.082; 414/315, 320
See application file for complete search history.

(56) References Cited

U.S. PATENT DOCUMENTS

| | | | |
|---|---|---|---|
| 4,864,119 | A | 9/1989 | Ragle et al. |
| 5,073,718 | A | 12/1991 | Paolella |
| 6,734,515 | B1 | 5/2004 | Tadatomo et al. |
| 7,705,415 | B1 | 4/2010 | Nabet |
| 8,183,512 | B2 | 5/2012 | Mazumder et al. |
| 8,294,078 | B2 | 10/2012 | Mazumder et al. |
| 2002/0025661 | A1 | 2/2002 | Nikolaev et al. |
| 2003/0042404 | A1* | 3/2003 | Rice ............... H01L 31/0304 250/214.1 |
| 2004/0000670 | A1 | 1/2004 | Oh et al. |
| 2007/0092812 | A1* | 4/2007 | Caporaso .......... H01L 31/09 430/57.7 |
| 2007/0202360 | A1 | 8/2007 | Chaudhari et al. |
| 2009/0085056 | A1 | 4/2009 | Kumtornkittikul |
| 2009/0166674 | A1 | 7/2009 | Iwaya et al. |
| 2010/0282949 | A1* | 11/2010 | Caporaso .......... H01L 31/09 250/214 SW |
| 2012/0120478 | A1 | 5/2012 | Julien et al. |
| 2013/0334537 | A1 | 12/2013 | Helava et al. |
| 2015/0187970 | A1 | 7/2015 | Curry et al. |

OTHER PUBLICATIONS

PCT/US13/54699 International Search Report and Written Opinion mailed Feb. 27, 2014 (8 pages).

2012 IEEE International Power Modulator and High Voltage Conference (IPMHVC); Jun. 7, 2012 (Jun. 7, 2012) table of contents see p. 12.

Kinsey et al.; "Design and Testing of wide bandgap current limiting devices"; Power Modulation and High Voltage Conference (IPMHVC) 2012 IEEE International Jun. 7, 2012 (Jun. 7, 2012); p. 343-346; [retrieved on Feb. 3, 2014]. Retrieved from the Internet: <URL: http://ieeexplore.ieee.org/xpl/login.jsp?tp=&arnumber=6518750&url=http%3A%2F%2Fieeexplore.ieee.org%2Fxpls%2Fabs_all.jsp%3Farnumber%3D6518750>DOI:10.1109/IPMHVC.2012.6518750.

* cited by examiner

OPTICALLY ACTIVATED LINEAR SWITCH FOR RADAR LIMITERS OR HIGH POWER SWITCHING APPLICATIONS

CROSS REFERENCE TO RELATED APPLICATIONS

This application is claims priority to U.S. Provisional Patent application, Ser. No. 61/682,606, filed Aug. 13, 2012, entitled "An Optically Activated Linear Switch for Radar Limiters or High Power Switching Applications," which is hereby incorporated by reference in its entirety.

FEDERALLY SPONSORED RESEARCH OR DEVELOPMENT

This invention was made with government support under grant number HQOI47-II-C-7662 by the Missile Defense Agency. The government has certain rights in the invention.

FIELD OF THE INVENTION

The present invention relates to solid state limiter switches and systems, as well as, optically activated gallium nitride (GaN) or aluminum gallium nitride (AlGaN) linear mode switches. In particular, the present invention relates to a solid-state optically-triggered signal limiting device or switch based on an AlGaN semiconductor.

BACKGROUND OF THE INVENTION

A wide variety of electronic systems contain highly-sensitive electronic components, such as amplifiers and transistors, which can be damaged or destroyed by a discharge of high energy. Prior efforts to protect sensitive components from damage have included enclosing the components in a conductive metal structure to form a Faraday cage. Although effective, this solution prevents the systems from engaging in wireless communication with other systems or devices. Therefore, a need exists for a robust system or device that can protect sensitive electrical components from high energy discharges, high power microwaves, or high power radar signals without inhibiting or otherwise diminishing the other capabilities or functions of the components.

SUMMARY OF THE INVENTION

The present invention relates to optically activated switches that can be used as a limiting device or high power switch. The switches may be optically triggered to protect a variety of electrical systems and sensitive circuits from a high energy discharge, a high power microwave signal, or a high power radar signal while allowing the systems and circuits to communicate wirelessly with other systems. In one embodiment, the limiting device includes a semiconductor material that may include an aluminum gallium nitride layer, a conductive contact on the semiconductor material, and a set of one or more grounding electrodes also deposited on the surface of the semiconductor material. A portion of the semiconductor material separates set of one or more grounding electrodes from the conductive contact. The resistance of the portion of the semiconductor material between the conductive contact and the ground electrodes is decreased when contacted with an optical signal, such that an incident signal at the conductive contact is shunted to the one or more grounding contacts.

DETAILED DESCRIPTION OF THE INVENTION

The present invention relates to a solid-state optically activated limiting device that can effectively reduce the amplitude of harmful signals while allowing normal signals to pass unimpeded. As such, the device may be used in-line to protect a variety of electrical systems and their sensitive circuits while allowing them to communicate wirelessly with other systems. The effectiveness of various embodiments of the limiting device as a signal limiter was estimated by performing an electromagnetic analysis using Microwave Studio® by CST.

In one aspect, the limiting device includes an aluminum gallium nitride (AlGaN) semiconductor. AlGaN is selected due in part to its large band gap energy and its ability to withstand normal environmental conditions with little or no additional ancillary protective components. The limiting device may also be used for photoconductive switching. As such, the limiting device may be triggered optically to achieve sub-nanosecond rise times for switching, while also achieving a low-jitter response. Moreover, various embodiments of the limiting device have a structure and geometry configured to reduce an incident signal by 99% in an on-state (i.e. when the limiting device is optically illuminated). Conversely, the limiting device allows for up to and greater than 99.9999% transmission of the incident signal in an off-state (i.e. when the limiting device is not optically illuminated). The limiting device may be used in a variety of electrical systems. For example, the limiting device may operate in a linear mode to function as a limiter switch for sensitive electronic systems including, but not limited to, radar systems. The device may also have a structure and geometry configured to switch a high power signal in a very low loss mode. As such, the device may also be used as a high power switch for transfers of energy in series or in parallel arrangements.

Figure 1A:
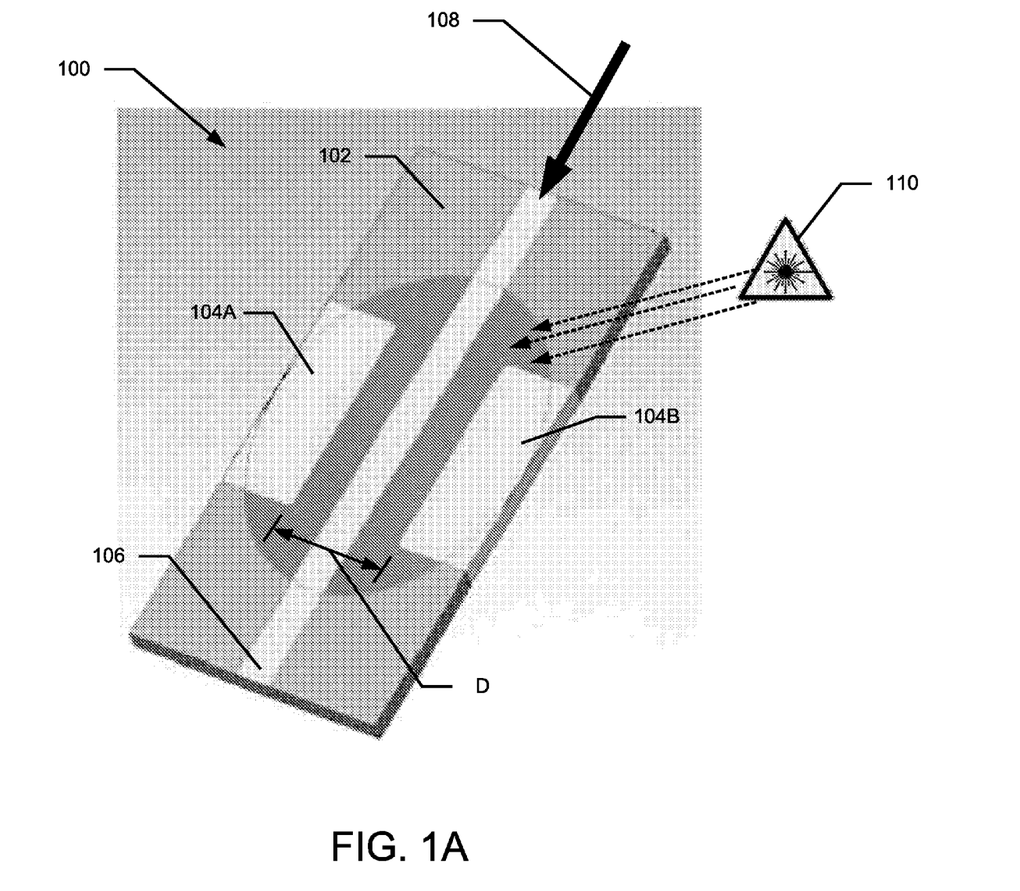
FIG. 1A depicts the limiting device according to one embodiment.

In one embodiment, the limiting device 100 has a modified coplanar configuration, as shown in FIG. 1A, which is well suited for use as an in-line signal limiter. The limiting device 100 includes an AlGaN or GaN wafer 102 consisting of an AlGaN layer having a thickness in a range between about 0.5 µm and about 2,000 µm grown on a substrate having a thickness in a range between about 100 μm and about 40,000 μm. In a preferred embodiment, the AlGaN layer is grown using any suitable method to a thickness of approximately 0.10-1000 μm on an approximately 400 μm thick sapphire substrate. In various other embodiments, other substrate materials and other thicknesses for the substrate materials may also be used. The limiting device 100 also includes one or more ground plane electrodes 104A-B. The plane electrodes 104A-B are dimensioned to limit the effect of leakage across the AlGaN wafer 102 and to maximize the off-state transmission of an incident signal. The limiting device 100 also includes a conductor contact 106. In one embodiment, the centrally-positioned conductor contact 106 is a microstrip conductor having a resistance in a range between about 30Ω and about 80Ω. Preferably, the conductor 106 has a resistance of approximately 50Ω.

In various embodiments, the central conductor 106 and the ground plane electrodes 104A-B are spaced to provide a negligible coupling effect. For example, an analysis may be performed to verify the impedance of an input signal by varying the spacing "D" between the conductor 106 and the plane electrodes 104A-B while recording the output voltage. The smallest spacing D that results in off-state transmission equal to or greater than 99% is desired. In various embodiments, the spacing D may be in a range between about 2 μm- and 50,000 μm.

By way of example and not limitation, the spacing D between the conductive contact or conductor 106 and the ground plane electrodes 104A-B may be carefully tailored to ensure minimal impedance ripple. Increasing the spacing D maximizes the off-state transmission of the incident signal by reducing the coupling between conductors (i.e. ground plane electrodes and central conductor) 104A-B and 106 and the impedance ripple. Conversely, decreasing the spacing D effectively decreases the on-state resistance, thereby maximizing the limiting effect of the device 100 for a given conductivity.

In this embodiment, an input signal 108 is applied to the conductive contact 106 while the plane electrodes 104A-B are held at ground potential. When the limiting device 100 is illuminated by a laser pulse 110, the resistivity of the AlGaN or GaN material decreases which forms a low-resistance electrical connection between the conductors 104A-B and 106. As a result, a portion of the input signal 108 is reflected back to the input and a portion of the input signal is shunted to ground. The limiting device 100, therefore provides dual, parallel current paths to ground (e.g. one to the left ground electrode 104A and one to the right ground electrode 104B), which decreases the effective channel resistance of the limiting device. In various embodiments, the decrease in the effective channel resistance may not scale linearly with the paths to ground.

Figure 1B:
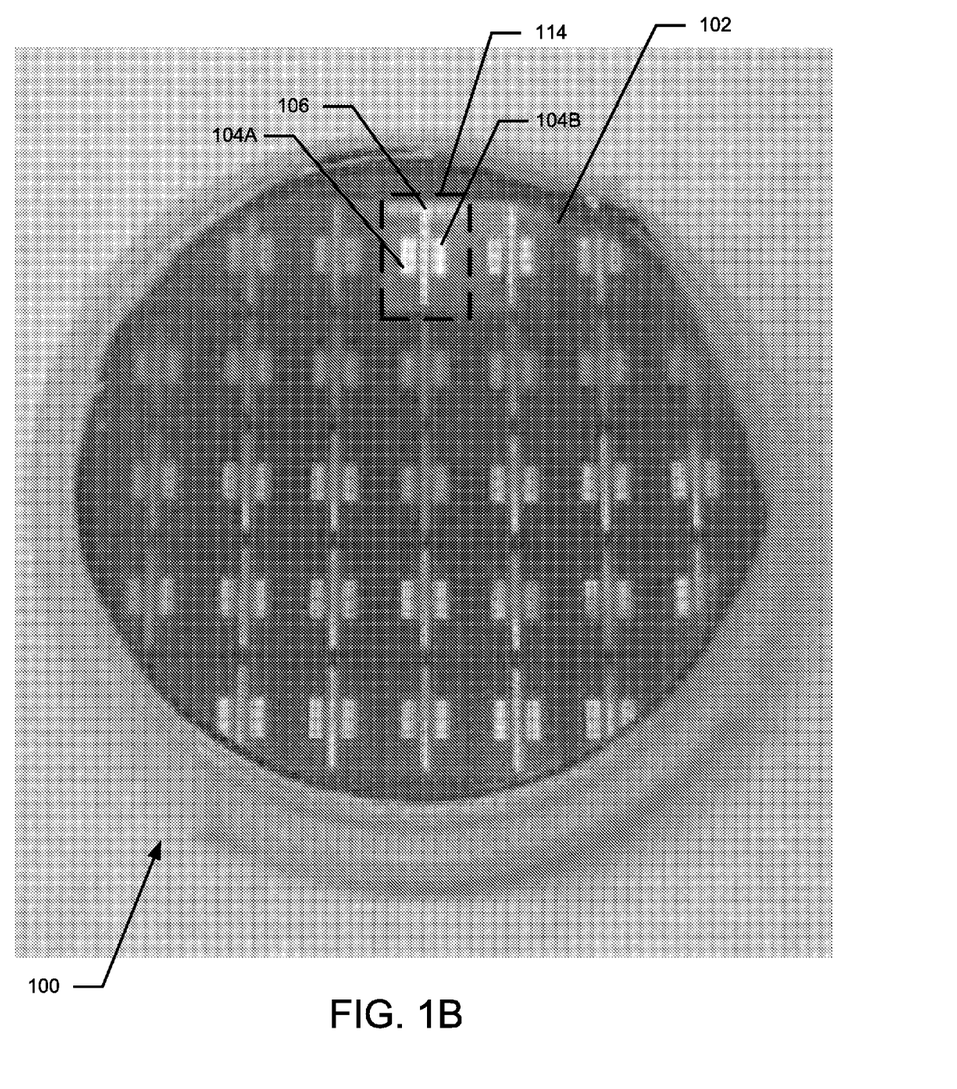
FIG. 1B depicts a semiconductor wafer with a number of limiting device conductive contacts and electrodes.

FIG. 1B depicts another embodiment of the limiter device 100. This embodiment includes an AlGaN or GaN wafer 102 that includes multiple arrangements of conductive contacts 106 and ground plane electrodes 104A-B. The multiple arrangements 114 of conductors 106 and ground electrodes 104A-B may be isolated or, alternately, in electrical communication with one another so that an input signal 108 at one conductor 16 may be shared across one or more other conductors. As such, an optical signal at one of the arrangements 114 may cause the input signal 108 at another arrangement to be shunted to ground.

To test the effectiveness of the coplanar embodiment of the limiting device 100, as shown in FIG. 1A, various simulations were conducted where a potential laser illumination region 112 was given a specific conductivity. The z-minimum plane for the simulation was set to a boundary condition where E=0 V/m to simulate a ground plane. A wideband Gaussian excitation pulse was used as the incident input signal 108 which spanned a frequency range of 0 GHz to 10 GHz. The input signal 108 was applied though a waveguide port and the transmitted signal was collected with a second waveguide port at an output. The conductivity value of the laser illumination region 112 was simulated with a conductivity value of $1\times10^{-3}$ S/m for the off-state and $1\times10^{7}$ S/m for the on-state.

Figure 2:
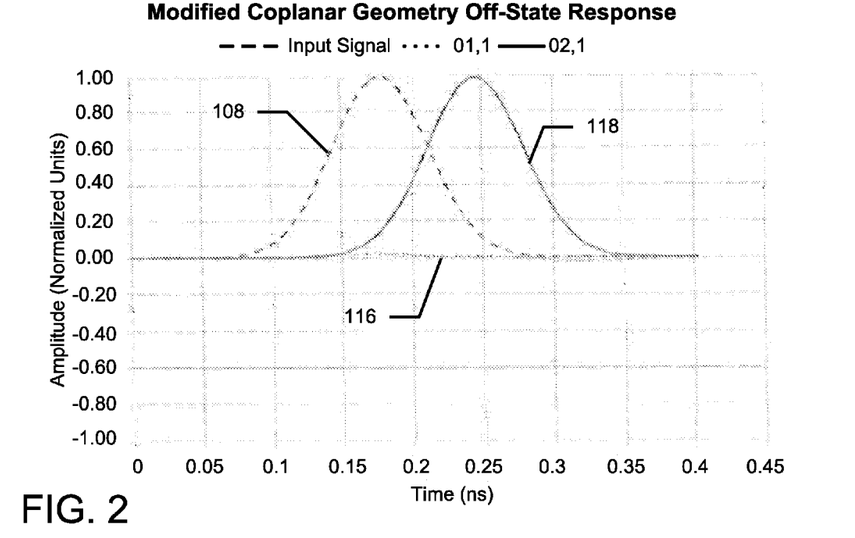
FIG. 2 is a graph an off-state transient response of the limiting device according to one embodiment.
Figure 3:
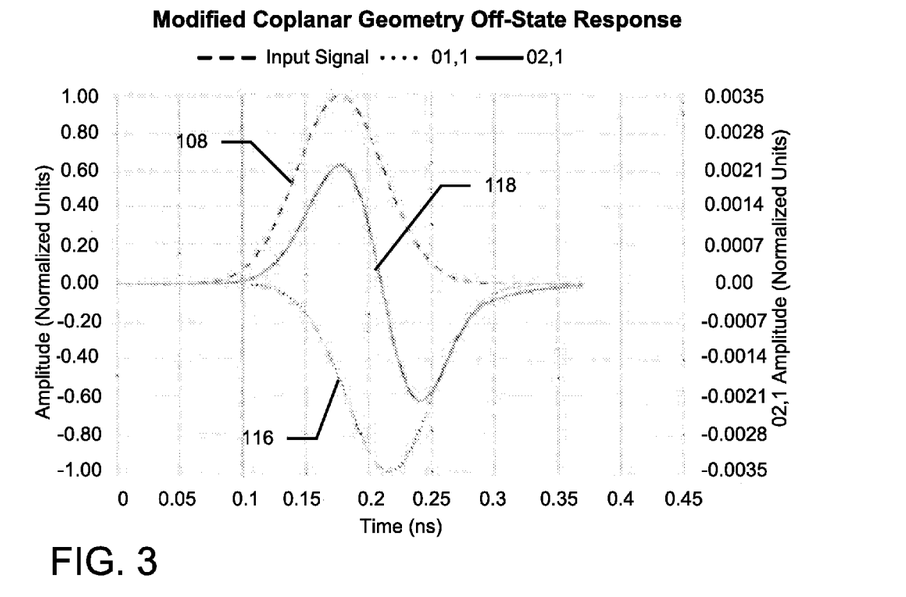
FIG. 3 is a graph an on-state transient response of the limiting device according to one embodiment.

FIG. 2 illustrates the off-state transient response for the coplanar limiting device 100. In particular, the graph illustrates the ability of the coplanar configuration to transmit normal signals for a conductivity of $1\times10^{-3}$-$1\times10^{-6}$ S/m. Similarly, FIG. 3 illustrates the on-state transient response for the coplanar limiting device 100. In particular, this graph illustrates the ability of the coplanar configuration to limit the amplitude of a harmful incident input signal for a spot conductivity of $1\times10^{7}$. As shown, the scale for the output is enlarged on the right hand axis of the graph.

In FIGS. 2-3, the input signal 108 is shown for reference, along with the signal 116 reflected back to the input and the output signal 118 at the second waveguide port. As shown, the off-state transmission response of the coplanar configuration illustrates the ability of the limiting device 100 to pass normal signals while the on-state transmission response illustrates the ability of the device to limit a harmful signal. As shown in FIG. 2, the off-state transmission response shows a transmission ratio greater than 99%. Such a ratio is well suited for a number of applications including, but not limited to use as a limiter switch for radar systems. The leakage current in the GaN or AlGaN can be controlled by the level of doping in the device 100. The doping can also selected to grade the electric field in the semiconductor or to provide an increase or decrease in the leakage current, as desired. The on-state attenuation of the incident input signal 108 is also very high for this configuration. As shown in FIG. 3, the incident input signal 108 was effectively limited to approximately 0.2% of its original magnitude, as indicated by 118. Alternatively, various geometries of the device 100 can be fabricated that can reflect approximately 99.9999% of the incident signal. This correlates to the approximate reduction of a 1 kV signal to a 2V signal. During illumination of the on-state, the majority of the incident pulse 108 is reflected back to the input, as indicated by 116, due to an effective short placed across the contacts 106 and 104A-B. As such, the coplanar configuration of the limiting device may be useful in a variety of applications as an in-line signal limiter.

Figure 4:
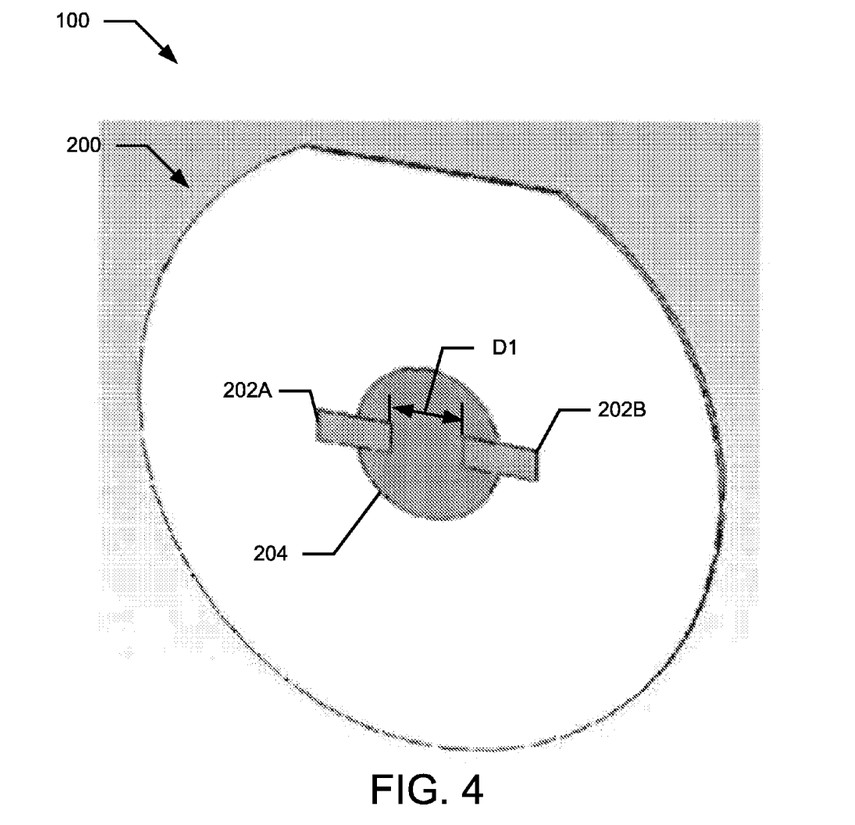
FIG. 4 depicts the limiting device according to one embodiment.

In another embodiment, as shown in FIG. 4, the limiting device 100 has a generally circular configuration 200. In this embodiment, the AlGaN or GaN wafer 102 may be manufactured with compensation doping to create a high-resistivity semiconductor. Alternatively, a high purity semiconductor can be used to reduce leakage currents in the device 100. Air-drying conductive silver paint, such as Silver Print II #22-023 produced by GC Electronics, may be used to create contacts 202A-B. In other embodiments, the contacts 202A-B can be sputtered onto the wafer using a vacuum deposition process. The paint was applied using masking to create rectangular contacts. In one embodiment, the contacts 202A-B are approximately 2 mm×4 mm, with a gap spacing D1 of approximately 3 mm. The laser illumination region 204 encompasses the gap spacing D1 between the two contacts 202A-B and provides a conductive channel between the contacts. In various embodiments, copper wire (not shown), for example AWG #30 wires, may be connected to the contacts 202A-B to ensure good electrical connections to other circuitry (not shown).

Figure 5:
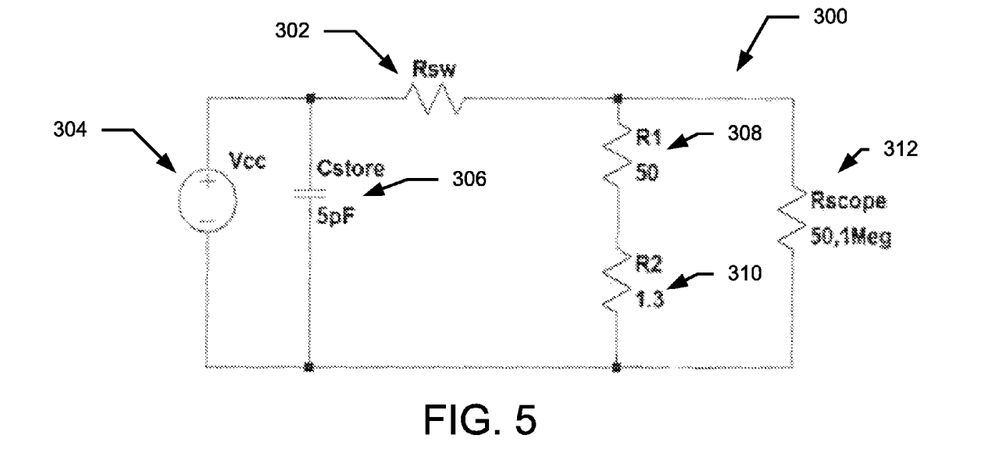
FIG. 5 is a series testing circuit for testing various embodiments of the limiting device according to one embodiment.

To test the ability of the circular configuration of the limiting device 100, as shown in FIG. 4, to act as an optical switch, the device was placed in series with other electrical components. A series testing circuit 300 for testing the limiting device 100 is shown in FIG. 5.

In one embodiment, a laser is used to illuminate the device 100. By way of example and not limitation, the laser may be a Spectra Physics DCR-11 Nd:YAG laser system. The output wavelength of the laser system was tripled to produce an approximately 355 nm beam to allow for more efficient carrier generation in the wide band gap AlGaN. The output laser light is filtered by a dichroic mirror reflective at 355-nm and directed onto the laser illumination region 204. The energy from the incident laser effectively modifies the resistance value of the device 100 indicated as the $R_{sw}$ resistor 302 that corresponds to the resistance between the contacts 202A-B. The testing circuit 300 also includes a voltage source 304, a capacitor 306, a first resistor (R1) 308, a second resistor (R2) 310, and an oscilloscope 312 indicated as $R_{scope}$. As shown, the oscilloscope 312 was used in both a 50Ω (DC coupling) and a 1 MΩ (AC coupling) termination configuration.

In equilibrium, the leakage current across the limiting device 100 gives rise to a steady-state switch resistance, and consequently, a steady-state load voltage. During illumination, the voltage at the load increases due to the decrease in the resistance between the contacts 202A-B (i.e. the $R_{sw}$ resistor 302). The change in the load voltage can then be used to determine the minimum achieved switch resistance according to Equation 1:

$$R_{sw}=([V_{cc}-(V_{base}+\Delta V_{load})]R'_{load})/(V_{base}+\Delta V_{load});$$  [Eq. 1]

where $V_{cc}$ is the applied voltage, $V_{base}$ is the equilibrium load voltage, and $R'_{load}=(R_1+R_2)\|R_{scope}$. Equation 1 is derived from Kirchhoff's current law and Kirchhoff's voltage law in view of the test circuit 300.

Figure 6:
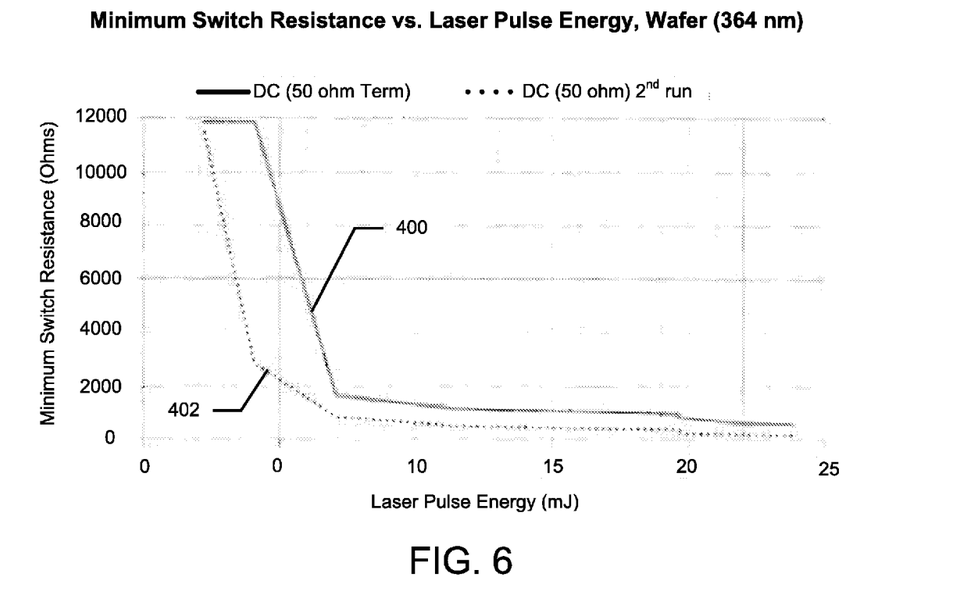
FIG. 6 is a graph of the minimum calculated switch resistance versus an incident pulse according to one embodiment.

FIG. 6 shows the minimum calculated switch resistance plotted against an incident pulse. As shown, the line 400 is a plot of the results from a first test run that was completed with a visual alignment of the laser onto the semiconductor channel. The line 402 is a plot of the results from a second test run that was completed by optimizing the position of the device to produce the largest change in load voltage as viewed on the oscilloscope 312.

As shown in FIG. 6, the initial switch resistance, with no illumination, was approximately 12 kΩ. FIG. 6 also illustrates a switching effect in the resistance. In particular, a change in switch resistance from 12 kΩ to below 2 kΩ was observed. As such, in one embodiment, only 5 mJ of energy resulted in a 6-fold decrease in the resistance of the device 100. This decrease indicates that the limiting device 100 is suitable for use with more compact excitation sources that produce lower energy pulses, such as but not limited to laser diodes or any other suitable light source, while still maintaining a high level of performance by the limiting device or the optically activated linear mode switch.

The final resistance, as shown in FIG. 6, indicates that the switch resistance approaches a minimum value of 200Ω. In various embodiments, the switch resistance as shown in FIG. 6 encompasses any external resistances in the structure in addition to the semiconductor channel resistance. These results, combined with semiconductor channel resistance predictions in the milliohm range, suggest that a limiting factor in the resistance is due to the large Schottky barrier between the silver paint contacts 202A-B and the wafer 102.

In various embodiments of the limiting device 100, ohmic contacts may be used for the contacts 202A-B. By way of example and not limitation, the contacts 202A-B may be titanium and/or aluminum based. In another example, the contacts 202A-B may include layers of titanium, aluminum, or combinations thereof. Such ohmic contacts may be used to lower the minimum switch resistance into the milliohm range.

Figure 7:
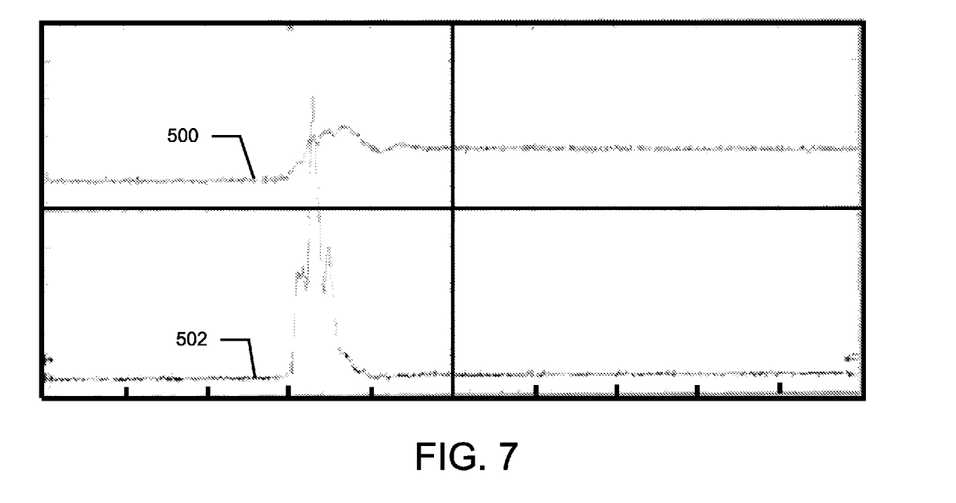
FIG. 7 is an oscilloscope trace of the AlGaN load voltage response according to one embodiment.

FIG. 7 illustrates the load voltage during switching as captured by the oscilloscope 312. The upper trace 500 is the load voltage shown with 200 mV/div and the lower trace 502 is the scattered optical pulse as detected by a Thorlabs DET 10A PIN photodetector with 300 mV/div. The time scale for the traces 500 and 502 is approximately 25 ns/div.

It will be appreciated that the device and method of the present invention are capable of being incorporated in the form of a variety of embodiments, only a few of which have been illustrated and described above. The invention may be embodied in other specific forms without departing from its spirit or essential characteristics. The described embodiments are to be considered in all respects only as illustrative and not restrictive and the scope of the invention is, therefore indicated by the appended claims rather than by the foregoing description. All changes which come within the meaning and range of equivalency of the claims are to be embraced within their scope.

What is claimed is:

1. An optically-activated semiconductor switch device comprising:
   a semiconductor material comprising nitride;
   a conductive contact engaged to and traversing the semiconductor material;
   a plurality of grounding electrodes engaged to the semiconductor material, wherein the conductive contact is disposed between the plurality of grounding electrodes, and a portion of the semiconductor material separates each of the grounding electrodes from the conductive contact;
   wherein, in an off-state, a majority of an incident signal received at the conductive contact is transmitted through the conductive contact; and,
   wherein, in an on-state when the semiconductor material is contacted with an optical signal, a majority of the incident signal received at the conductive contact is shunted to at least one grounding electrode of the plurality of grounding electrodes, reflected back to an input of the incident signal, or both.

2. The semiconductor switch device of claim 1 wherein a resistance of the portion of the semiconductor material is decreased when the portion of the semiconductor material is contacted with the optical signal.

3. The semiconductor switch device of claim 1, wherein the semiconductor device has a coplanar configuration and is configured as an in-line signal limiter.

4. The semiconductor switch device of claim 1 further comprising a substrate and wherein the semiconductor material is engaged to the substrate.

5. The semiconductor switch device of claim 4, wherein the semiconductor material is grown on the substrate.

6. The semiconductor switch device of claim 4 wherein the semiconductor material has a thickness in a range between about 0.5 μm and about 2000 μm and the substrate has a substrate thickness in a range between about 100 μm and about 40,000 μm.

7. The semiconductor switch device of claim 1, wherein the distance between the conductive contact and each of the plurality of grounding electrodes is in a range between about 2 μm and 50,000 μm.

8. The semiconductor switch device of claim 1, wherein the semiconductor device transmits signals for a conductivity in a range between about $1 \times 10^{-3}$ S/m and $1 \times 10^{-6}$ S/m, when the device is in the off-state.

9. The semiconductor switch device of claim 1, wherein the semiconductor device limits an amplitude of an undesired incident signal for a spot conductivity of approximately $1 \times 10^7$ S/m.

10. The semiconductor switch device of claim 1, wherein, when in the on-state, the semiconductor device limits an amplitude of an undesired input signal to approximately 0.2% of an original amplitude for the undesired input signal.

11. The semiconductor switch device of claim 1, wherein, when, in the on-state, the semiconductor device limits an amplitude of an undesired input signal having a voltage of approximately 1 kV to approximately 2 V.

12. The semiconductor switch device of claim 1, wherein the incident signal received at the conductive contact is switched in a series to one or more of the plurality of grounding electrodes, when the portion of the semiconductor material is contacted with an optical signal.

13. An optically-activated semiconductor switch device comprising:
    a doped semiconductor material comprising nitride;
    a plurality of conductive contacts engaged to the doped semiconductor material;
    a plurality of grounding electrode pairs engaged to the doped semiconductor material, wherein each of the plurality of conductive contacts is disposed between pairs of the plurality of grounding electrodes, and portions of the doped semiconductor material separate each grounding electrode of the pairs of grounding electrode pairs from each conductive contact of the plurality of conductive contacts disposed therebetween; and,
    wherein, in an off-state, a majority of an incident signal received at at least one conductive contact of the plurality of conductive contacts is transmitted through the at least one conductive contact; and,
    wherein, in an on-state when the portions of the doped semiconductor material are contacted with an optical signal, a majority of the incident signal received at the at least one conductive contact is shunted to at least one of the grounding electrodes of the corresponding grounding electrode pairs, reflected back to an input of the incident signal, or both.

14. An optically-activated semiconductor switch device configured as a switch, the switch device comprising:
    at least one compensation-doped semiconductor material comprising nitride;
    two or more conductive contacts engaged to a surface of the at least one compensation-doped semiconductor material, wherein the two or more conductive contacts define an illumination region on the surface of the at least one compensation-doped semiconductor material therebetween;
    wherein the illumination region defines a conductive channel between the conductive contacts;
    wherein an optical signal received at the illumination region on the surface decreases the resistance of the at least one compensation-doped semiconductor material to permit an incident signal received at at least one of the two or more conductive contacts to traverse the illumination region.

15. The semiconductor switch device of claim 14, wherein the two or more conductive contacts are painted on to the at least one compensation-doped semiconductor material.

16. The semiconductor switch device of claim 14, wherein the two or more conductive contacts are sputtered on to the at least one compensation-doped semiconductor material by a vacuum deposition.

17. The semiconductor switch device of claim 14, wherein the distance between the two or more conductive contacts is approximately 3 mm.

18. The semiconductor switch device of claim 14, wherein the two or more conductive contacts are further engaged to conductive wires to permit electrical communication with one or more circuits engaged to the at least one compensation-doped semiconductor material.

19. The semiconductor switch device of claim 14, wherein optical signal is generated by a laser and the optical signal causes up to an approximate 6-fold decrease in a resistivity of the illumination region.

20. The semiconductor switch device of claim 14, wherein the two or more conductive contacts are ohmic contacts.

21. The semiconductor switch device of claim 20, wherein the two or more ohmic conductive contacts comprise titanium, aluminum, or combinations thereof.

22. The semiconductor switch device of claim 20, wherein the two or more ohmic conductive contacts reduce a resistance of the switch device to one ohm or less.

* * * * *